US012648278B2

(12) United States Patent
Li

(10) Patent No.: US 12,648,278 B2
(45) Date of Patent: Jun. 2, 2026

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhuhui Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1040 days.

(21) Appl. No.: 17/756,653

(22) PCT Filed: May 13, 2022

(86) PCT No.: PCT/CN2022/092659
§ 371 (c)(1),
(2) Date: Nov. 2, 2023

(87) PCT Pub. No.: WO2023/206615
PCT Pub. Date: Nov. 2, 2023

(65) Prior Publication Data
US 2024/0162398 A1 May 16, 2024

(30) Foreign Application Priority Data
Apr. 25, 2022 (CN) .......................... 202210441909.5

(51) Int. Cl.
*H01L 33/62* (2010.01)
*H01L 25/16* (2023.01)
(Continued)

(52) U.S. Cl.
CPC .......... *H10H 20/857* (2025.01); *H10H 29/30* (2025.01); *H10W 90/00* (2026.01)

(58) Field of Classification Search
CPC . H01L 25/0753; H01L 25/167; H10H 20/857; H10H 29/142; H10H 29/30
See application file for complete search history.

(56) References Cited

U.S. PATENT DOCUMENTS

2020/0111391 A1* 4/2020 Chao .................... G02B 6/4298

FOREIGN PATENT DOCUMENTS

| CN | 102467853 B | 11/2013 |
| CN | 104637983 A | 5/2015 |
| | (Continued) | |

OTHER PUBLICATIONS

International Search Report in International application No. PCT/CN2022/092659, mailed on Dec. 16, 2022.
(Continued)

*Primary Examiner* — Deeprose Subedi
(74) *Attorney, Agent, or Firm* — PV IP PC; Wei Te Chung

(57) ABSTRACT
A display panel and a display device are provided. The display panel includes at least two splicing light-emitting units spliced with each other. A first signal line and a second signal line are respectively disposed on a first side surface of the carrier substrate and a second side surface opposite to the first side surface of the carrier substrate. The first signal line is electrically connected to the first connection line, and the second signal line is electrically connected to the second connection line. The present application adds input paths of the first input signal and the second input signal, and improves the problems of brightness difference and uniformity deterioration.

20 Claims, 2 Drawing Sheets

(51) Int. Cl.
　　H10H 20/857　　　(2025.01)
　　H10H 29/30　　　(2025.01)
　　H10W 90/00　　　(2026.01)

(56)　　　　　References Cited

FOREIGN PATENT DOCUMENTS

| | | | |
|---|---|---|---|
| CN | 110060964 | A | 7/2019 |
| CN | 110708790 | A | 1/2020 |
| CN | 111092108 | A | 5/2020 |
| CN | 111913323 | A | 11/2020 |
| CN | 113241038 | A | 8/2021 |
| JP | 2021027187 | A | 2/2021 |
| KR | 20210079600 | A | 6/2021 |

OTHER PUBLICATIONS

Written Opinion of the International Search Authority in International application No. PCT/CN2022/092659, mailed on Dec. 20, 2022.
Chinese Office Action issued in corresponding Chinese Patent Application No. 202210441909.5 dated Dec. 5, 2024, pp. 1-6.

\* cited by examiner

DISPLAY PANEL AND DISPLAY DEVICE

FIELD OF INVENTION

The present application relates to the field of display technology, and in particular, to a display panel and a display device.

BACKGROUND OF INVENTION

Micro light-emitting diode (Mini-LED) splicing screen can achieve seamless splicing, high brightness, and high pixel per inch (PPI) display. The Mini-LED splicing screen is thin and beautiful, but due to a small and thin backplate circuit, IR Drop is easy to appear at a terminal of the splicing screen (voltage drop) phenomenon, resulting in a deterioration of a brightness uniformity of a whole machine.

Embodiments of the present application provide a display panel and a display device to solve the technical problem that the currently display panel and display device are prone to an IR Drop phenomenon at end of a splicing screen, which leads to the deterioration of the brightness uniformity of the whole machine.

SUMMARY OF INVENTION

In order to solve the above-mentioned problems, the technical solutions provided by this application are as follows:

The present application provides a display panel, including at least two splicing light-emitting units spliced with each other, wherein each of the splicing light-emitting unit including a carrier substrate;

a carrier substrate;

a plurality of light-emitting elements arranged in an array on the carrier substrate;

a plurality of first connection lines disposed on the carrier substrate; and a plurality of second connection lines disposed on the carrier substrate;

wherein first terminals of all the light-emitting elements in a same row are electrically connected in parallel with the first connection lines, and wherein second terminals of all the light-emitting elements in a same row are electrically connected in parallel with the second connection lines;

wherein a first signal line and a second signal line are respectively disposed on a first side surface of the carrier substrate and a second side surface opposite to the first side surface of the carrier substrate;

wherein the first signal line is VDD signal line, and wherein the second signal line is a VSS signal line;

wherein the first signal line is electrically connected to the first connection line, and wherein the second signal line is electrically connected to the second connection line; and wherein a first input signal is sequentially input to the light-emitting element through the first signal line and the first connection line, and wherein a second input signal is sequentially input to the light-emitting element through the second signal line and the second connection line to the light-emitting element.

According to the display panel provided by one embodiment of the present application, all the light-emitting elements in the same row are arranged along a first direction, and wherein both the first signal line and the second signal line extend in a second direction intersecting the first direction;

wherein the first signal lines are positioned on different sides of the carrier substrates of two adjacent splicing light-emitting units in a same row, and wherein the second signal lines are positioned on different sides of the carrier substrates of two adjacent splicing light-emitting units in a same row.

According to the display panel provided by one embodiment of the present application, the first signal lines are positioned on a same side of the carrier substrates of two adjacent splicing light-emitting units in a same column, and wherein the two second signal lines are positioned on a same side of the carrier substrates of two adjacent splicing light-emitting units in a same column.

According to the display panel provided by one embodiment of the present application, the display panel further includes a first auxiliary signal line and a second auxiliary signal line, and wherein the first auxiliary signal line is positioned on at least one side of the splicing light-emitting unit, wherein the second auxiliary signal line is positioned on at least one side of the splicing light-emitting unit, and wherein the first auxiliary signal line and the second auxiliary signal line are correspond to at least two adjacent splicing light-emitting units;

wherein the first auxiliary signal line is electrically connected to the first signal line, and wherein the second auxiliary signal line is electrically connected to the second signal line;

wherein the first input signal is sequentially input to the light-emitting element through the first auxiliary signal line and the first signal line, and wherein the second input signal is sequentially input to the light-emitting element through the second auxiliary signal line and the second signal line.

According to the display panel provided by one embodiment of the present application, the display panel further includes a first signal bus line and a second signal bus line, wherein the first auxiliary signal line is connected to the first signal bus line, and wherein the second auxiliary signal line is connected to the second signal bus line; and wherein the first input signal is sequentially input to the light-emitting element through the first signal bus line, the first auxiliary signal line, and the first signal line, and wherein the second input signal is sequentially input to the light-emitting element through the second signal bus line, the second auxiliary signal line, and the second signal line.

According to the display panel provided by one embodiment of the present application, a line width of the first auxiliary signal line is less than an interval size between the two adjacent splicing light-emitting units, and wherein a line width of the second auxiliary signal line is less than the interval size between the two adjacent splicing light-emitting units.

According to the display panel provided by one embodiment of the present application, the line width of the first auxiliary signal line ranges from 40 micrometers to 200 micrometers, and wherein the line width of the second auxiliary signal line ranges from 40 micrometers to 200 micrometers.

According to the display panel provided by one embodiment of the present application, the first signal line and the second signal line are arranged in a same layer, and wherein the first auxiliary signal line and the second auxiliary signal line are arranged in a same layer, and wherein the first auxiliary signal line and the second auxiliary signal line are plug-in signal lines.

The present application also provides a display panel, including at least two splicing light-emitting units spliced to each other, wherein each of the splicing light-emitting units including: a carrier substrate;

a plurality of light-emitting elements arranged in an array on the carrier substrate;

a plurality of first connection lines disposed on the carrier substrate; and a plurality of second connection lines disposed on the carrier substrate;

wherein first terminals of all the light-emitting elements in a same row are electrically connected with the first connection lines, and wherein second terminals of all the light-emitting elements in a same row are electrically connected with the second connection lines;

wherein a first signal line and a second signal line are respectively disposed on a first side surface of the carrier substrate and a second side surface opposite to the first side surface of the carrier substrate;

wherein the first signal line is electrically connected to the first connection line, and wherein the second signal line is electrically connected to the second connection line; and wherein a first input signal is sequentially input to the light-emitting element through the first signal line and the first connection line, and wherein a second input signal is sequentially input to the light-emitting element through the second signal line and the second connection line to the light-emitting element.

According to the display panel provided by one embodiment of the present application, all the light-emitting elements in the same row are arranged along a first direction, and wherein both the first signal line and the second signal line extend in a second direction intersecting the first direction;

wherein the first signal lines are positioned on different sides of the carrier substrates of two adjacent splicing light-emitting units in a same row, and wherein the second signal lines are positioned on different sides of the carrier substrates of two adjacent splicing light-emitting units in a same row.

According to the display panel provided in the present application, the first signal lines are positioned on a same side of the carrier substrates of two adjacent splicing light-emitting units in a same column, and wherein the two second signal lines are positioned on a same side of the carrier substrates of two adjacent splicing light-emitting units in a same column.

According to the display panel provided by one embodiment of the present application, the display panel further includes a first auxiliary signal line and a second auxiliary signal line, and wherein the first auxiliary signal line is positioned on at least one side of the splicing light-emitting unit, wherein the second auxiliary signal line is positioned on at least one side of the splicing light-emitting unit, and wherein the first auxiliary signal line and the second auxiliary signal line are correspond to at least two adjacent splicing light-emitting units;

wherein the first auxiliary signal line is electrically connected to the first signal line, and wherein the second auxiliary signal line is electrically connected to the second signal line;

wherein the first input signal is sequentially input to the light-emitting element through the first auxiliary signal line and the first signal line, and wherein the second input signal is sequentially input to the light-emitting element through the second auxiliary signal line and the second signal line.

According to the display panel provided by one embodiment of the present application, the display panel further includes a first signal bus line and a second signal bus line, and wherein the first auxiliary signal line is connected to the first signal bus line, and wherein the second auxiliary signal line is connected to the second signal bus line; and wherein the first input signal is sequentially input to the light-emitting element through the first signal bus line, the first auxiliary signal line, and the first signal line, and wherein the second input signal is sequentially input to the light-emitting element through the second signal bus line, the second auxiliary signal line, and the second signal line.

According to the display panel provided by one embodiment of the present application, a line width of the first auxiliary signal line is less than an interval size between the two adjacent splicing light-emitting units, and wherein a line width of the second auxiliary signal line is less than the interval size between the two adjacent splicing light-emitting units.

According to the display panel provided by one embodiment of the present application, the line width of the first auxiliary signal line ranges from 40 micrometers to 200 micrometers, and wherein the line width of the second auxiliary signal line ranges from 40 micrometers to 200 micrometers.

According to the display panel provided by one embodiment of the present application, the first signal line and the second signal line are arranged in a same layer, and wherein the first auxiliary signal line and the second auxiliary signal line are arranged in a same layer, and wherein the first auxiliary signal line and the second auxiliary signal line are plug-in signal lines.

According to the display panel provided by one embodiment of the present application, all the light-emitting elements in a same row are connected in parallel with the first connection line and the second connection line, respectively.

According to the display panel provided by one embodiment of the present application, the light-emitting element is a Mini-LED or a Micro-LED.

According to the display panel provided by one embodiment of the present application, the first signal line is VDD signal line, and wherein the second signal line is a VSS signal line.

The present application also provides a display device, including:

a display panel including at least two splicing light-emitting units spliced with each other, wherein each of the splicing light-emitting unit including:

a carrier substrate;

a plurality of light-emitting elements arranged in an array on the carrier substrate;

a plurality of first connection lines disposed on the carrier substrate;

a plurality of second connection lines disposed on the carrier substrate; and at least two assembling mechanisms, wherein each of the assembling mechanisms is disposed corresponding to the splicing light-emitting unit, to fix the splicing light-emitting unit on a frame;

wherein first terminals of all the light-emitting elements in a same row are electrically connected with the first connection lines, and wherein second terminals of all the light-emitting elements in a same row are electrically connected with the second connection lines;

wherein a first signal line and a second signal line are respectively disposed on a first side surface of the carrier substrate and a second side surface opposite to the first side surface of the carrier substrate;

wherein the first signal line is electrically connected to the first connection line, and wherein the second signal line is electrically connected to the second connection line; and wherein a first input signal is sequentially input to the light-emitting element through the first signal line and the first connection line, and wherein a second input signal is sequentially input to the light-emitting element through the second signal line and the second connection line to the light-emitting element.

The beneficial effects of the present application are as follows: A display panel and a display device are provided by the present application, wherein the display panel includes at least two splicing light-emitting units spliced with each other, by electrically connecting a first signal line and a second signal line to the plurality of light-emitting elements on the first side and the second side of the carrier substrate of each splicing light-emitting unit respectively, electrically connecting the first signal line to the first connection line, and electrically connecting the second signal line to the second connection line, compared with the prior art in which the first input signal and the second input signal are directly input into the light-emitting element through the first connecting line and the second connecting line, a first input signal of the present application is sequentially input to the light-emitting element through the first signal line and the first connection line, and wherein a second input signal of the present application is sequentially input to the light-emitting element through the second signal line and the second connection line to the light-emitting element. Therefore, the input paths of the first input signal and the second input signal are added, so that a resistance of the first connection line and a resistance of the second connection line can be reduced, and the problems of brightness difference and uniformity deterioration of the display device caused by the signal voltage drop can be improved.

DESCRIPTION OF FIGURES

In order to more clearly illustrate the embodiments or technical solutions in the prior art, the following briefly introduces the accompany figures that are used in the description of the embodiments or the prior art. Obviously, the figures in the following description are only some embodiments of the present application. For those of ordinary skill in the art, other figures can also be obtained from these figures without any inventive steps.

DETAILED DESCRIPTION OF EMBODIMENTS

The technical solutions in the embodiments of the present application will be clearly and completely described below with reference to the figures in the embodiments of the present application. Obviously, the described embodiments are only a part of the embodiments of the present application, but not all of the embodiments. Based on the embodiments in the present application, all other embodiments obtained by those skilled in the art without inventive steps fall within a protection scope of the present application. In addition, it should be understood that the specific embodiments described herein are only used to illustrate and explain the present application, but not to limit the present application. In the present application, unless otherwise stated, the directional words used such as "upper" and "lower" generally refer to an upper side and a lower side of the device in actual use or operating state, specifically a figure direction in the accompany figures; while "inside" and "outside" refer to an outline of the device.

In order to solve the problem that in the currently splicing screen, a phenomenon of IR drop (voltage drop) which leads to a deterioration of a brightness uniformity of a whole machine easily occurs at end of the splicing screen because a backplate circuit is small and thin, embodiments of the present application provide a display panel and a display device, which are described below with reference to the accompany figures.

Figure 1:
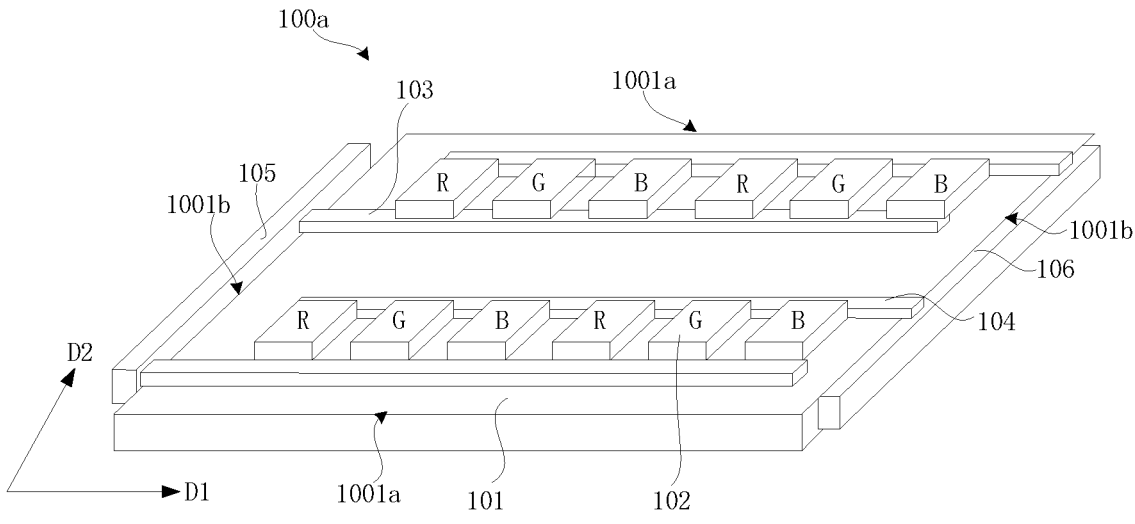
FIG. 1 is a schematic structural diagram of a splicing display unit provided by one embodiment of the present application.
Figure 2:
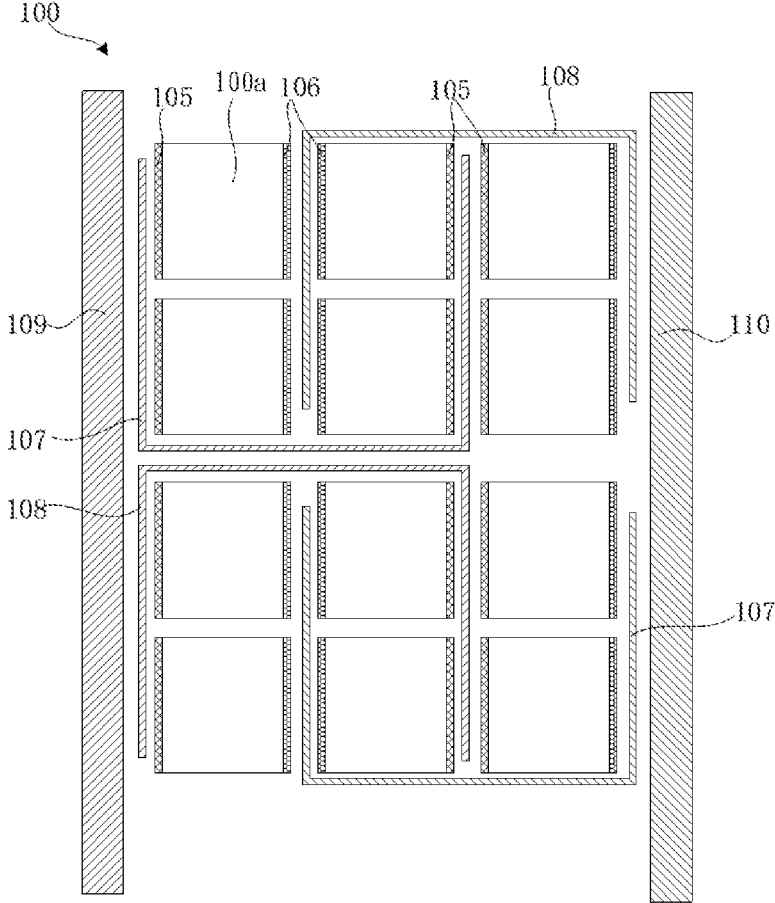
FIG. 2 is a schematic structural diagram of a display panel provided by one embodiment of the present application.

Please refer to FIG. 1 and FIG. 2, FIG. 1 is a schematic structural diagram of a splicing display unit provided by one embodiment of the present application; FIG. 2 is a schematic structural diagram of a display panel provided by one embodiment of the present application. The display panel 100 provided in the embodiment of the present application includes at least two splicing light-emitting units 100a spliced with each other. Each of the splicing light-emitting units 100a includes a carrier substrate 101, a plurality of light-emitting elements 102 arranged in an array on the carrier substrate 101, a plurality of first connection lines 103, and a plurality of second connection lines 104. All the light-emitting elements 102 in a same row are electrically connected to the first connection line 103 and the second connection line 104.

A first signal line 105 and a second signal line 106 are respectively disposed on a first side surface 1001a of the carrier substrate 101 and a second side surface 1001b opposite to the first side surface 1001a of the carrier substrate 101. The first signal line 105 is electrically connected to the first connection line 103. The second signal line 106 is electrically connected to the second connection line 104. A first input signal is sequentially input to the light-emitting element 102 through the first signal line 105 and the first connecting line 103. A second input signal is sequentially input to the light-emitting element 102 through the second signal line 106 and the second connection line 104 to the light-emitting element.

It can be understood that, compared with the prior art in which the first input signal and the second input signal are directly input to the light-emitting element 102 through the first connection line 103 and the second connection line 104, the present application adds input paths of the first input signal and the second input signal, so that a resistance of the first connection line 103 and a resistance of the second connection line 104 can be reduced, and the problems of luminance difference and uniformity deterioration of the display device caused by the signal voltage drop can be improved.

The carrier substrate 101 may be understood as a support or a carrier member of the splicing light-emitting unit 100a. The carrier substrate 101 is disposed on a back of the display surface of the display device. The carrier substrate 101 have a hollow frame structure to reduce the weight of the carrier substrate 101. The carrier substrate 101 is generally set to suit the splicing light-emitting unit 100*a*. For example, the carrier substrate 101 may be a carrier substrate 101 of a preset size, that is, a preset size to be determined by splicing at least two of the splicing light-emitting units 100*a*. The carrier substrate 101 can be a transparent substrate, including a glass substrate and a flexible substrate.

Exemplarily, each of the splicing light-emitting units 100*a* includes a plurality of the light-emitting elements 102, a plurality of the first connection lines 103, and a plurality of the second connection lines 104, wherein the light-emitting element 102 may be Mini-LED or Micro-LED. The plurality of the light-emitting elements 102 are arranged in M rows and N columns, the values of M and N are set according to a size of the light-emitting element 102 and a size of the splicing light-emitting unit 100*a*. M and N are positive integers. For example, in the figure, M is equal to 2, and N is equal to 6, that is, 12 of the light-emitting elements 102 are arranged in 2 rows and 6 columns, so as to form one splicing light-emitting unit 100*a*. It should be noted that the values of M and N may or may not be equal. Of course, the values of M and N may also have other combinations, and examples will not be provided here.

In order to enable the light-emitting element 102 to emit light, a voltage signal needs to be provided to the light-emitting element 102. Exemplarily, each row of the light-emitting elements 102 is connected to the first connection line 103 and the second connection line 104, so that the light-emitting elements 102 emit light according to a preset program. Of course, it can also be disposed that each column of the light-emitting elements 102 is connected to the first connection line 103 and the second connection line 104. The direction of rows and columns are relative. In one embodiment of the present application, a row direction of the light-emitting element 102 is same as a row direction of the splicing light-emitting unit 100*a*.

Specifically, in one embodiment, the first signal line 105 is a VDD signal line, the second signal line 106 is a VSS signal line, and correspondingly, the first input signal is a positive signal. Alternatively, in another embodiment, the first signal line 105 is a VSS signal line, the second signal line 106 is a VDD signal line, and correspondingly, the first input signal is a negative signal.

It should be noted that, in order to clearly describe the technical solutions provided by one embodiment of the present application, the embodiments of the present application take the example that the first signal line 105 may be a VDD signal line and the second signal line 106 may be a VSS signal.

The plurality of first connecting lines 103 of each of the splicing light-emitting units 100*a* are directly or indirectly electrically connected to each other. The plurality of the second connecting lines 104 of each of the splicing light-emitting units 100*a* are also directly or indirectly electrically connected to each other.

All the light-emitting elements 102 in a same row are arranged along a first direction D1, and the first signal line 105 and the second signal line 106 both extend along the second direction D2 intersecting with the first direction D1. In one embodiment of the present application, the first direction D1 and the second direction D2 are perpendicular to each other. Specifically, the first direction D1 is parallel to the first side surface 1001*a*, and the second direction D2 is parallel to the second side surface 1001*b*. Two first signal lines 105 are positioned on different sides of the carrier substrates 101 of two adjacent splicing light-emitting units

100*a* in a same row, and two second signal lines 106 are positioned on different sides of the carrier substrates 101 of two adjacent splicing light-emitting units 100*a* in a same row, to prevent a short circuit occurs when the two first signal lines 105 of the two adjacent splicing light-emitting units 100*a* are arranged adjacently, to prevent a short circuit occurs when the two second signal lines 106 are arranged adjacently, and to prevent the display effect is affected.

Further, the two first signal lines 105 are positioned on a same side of the carrier substrates 101 of two adjacent splicing light-emitting units 100*a* in a same column, and wherein the two second signal lines 106 are positioned on a same side of the carrier substrates 101 of two adjacent splicing light-emitting units 100*a* in a same column, to facilitate the connection of the first signal lines 105 and the second signal lines 106 to the first signal bus line 109 and the second signal bus line 110 respectively, which is beneficial to simplify wiring.

Further, the display panel 100 further includes a first auxiliary signal line 107 and a second auxiliary signal line 108. The first auxiliary signal line 107 is positioned on at least one side of the splicing light-emitting unit 100*a*. The second auxiliary signal line 108 is positioned on at least one side of the splicing light-emitting unit 100*a*. The first auxiliary signal line 107 and the second auxiliary signal line 108 correspond to at least two adjacent splicing light-emitting units 100*a*. The first auxiliary signal line 107 is electrically connected to the first signal line 105. The second auxiliary signal line 108 is electrically connected to the second signal line 106. The first input signal is sequentially input to the light-emitting element 102 through the first auxiliary signal line 107 and the first signal line 105. The second input signal is sequentially input to the light-emitting element 102 through the second auxiliary signal line 108 and the second signal line 106.

The display panel 100 further includes a first signal bus line 109 and a second signal bus line 110. In one embodiment of the present application, the first signal bus line 109 and the second signal bus line 110 are positioned on the opposite sides of an entire splicing module formed by the splicing light-emitting units 100*a*. Specifically, the first signal bus line 109 is positioned on one side of the second side surface 1001*b* of the adjacent splicing light-emitting unit 100*a*, and the second signal bus line 110 is located on one side of the second side surface 1001*b* of the adjacent splicing light-emitting unit 100*a*.

The first auxiliary signal line 107 is connected to the first signal bus line 109. The second auxiliary signal line 108 is connected to the second signal line 106. The first input signal is sequentially input to the light-emitting element 102 through the first signal bus line 109, the first auxiliary signal line 107, and the first signal line 105. The second input signal is sequentially input to the light-emitting element 102 through the second signal bus line 110, the second auxiliary signal line 108, and the second signal line 106.

In order to further reduce a resistance, all the light-emitting elements 102 in a same row are connected in parallel with the first connection line 103 and the second connection line 104 respectively, compared with all the light-emitting elements 102 in a same row being connected in series and then connected to the first connection line 103 or the second connection line 104, the driving voltage applied to the light-emitting elements 102 can be reduced, which is beneficial to further improve a brightness difference and uniformity deterioration of the display device caused by a voltage drop.

A signal transmission path in the prior art: the first input signal is transmitted to the first signal bus line 109, and then transmitted to the first connection line 103, and the transmitted to the light-emitting element 102; the second input signal is transmitted to the second signal bus line 110, and then transmitted to the second connection line 104, and then transmitted to the light-emitting element 102. On this basis, the present application adds a signal transmission path: the first input signal is transmitted to the first signal bus line 109, and then transmitted to a first auxiliary connection line, then transmitted to the first signal line 105, then transmitted to the first connection line 103, and then transmitted to the light-emitting element 102; the second input signal is transmitted to the second signal bus line 110, then transmitted to a second auxiliary connection line, and then transmitted to the second signal line 106, then transmitted to the second connection line 104, then transmitted to the light-emitting element 102.

Assuming that a resistance value between the first signal bus line 109 and the first connection line 103 in a signal transmission path in the prior art is R1, a resistance between the first signal bus line 109 and the first connection line 103 in the newly added signal transmission path of the present application is R2, then the two signal transmission paths are equivalent to a parallel relationship, and a resistance value of the total resistance R between the first signal bus line 109 and the first connection line 103 after parallel connection is less than R1 and R2, thereby reducing a resistance value between the first signal bus line 109 and the light-emitting element 102, so that a voltage applied to the light-emitting element 102 is increased, which improves a problem of luminance variation and uniformity deterioration of the display device caused by a signal voltage drop.

In one embodiment, all the first signal lines 105 and all the second signal lines 106 are electrically connected to a corresponding first auxiliary signal line 107 and a corresponding second auxiliary signal line 108. That is, for all the splicing light-emitting 100a, the first input signal is sequentially input to the light-emitting element 102 through the first signal bus line 109, the first auxiliary signal line 107, and the first signal line 105; the second input signal is sequentially input to the light-emitting element 102 through the second signal bus line 110, the second auxiliary signal line 108, and the second signal line 106.

Specifically, each of the first auxiliary signal lines 107 and each of the second auxiliary signal lines 108 can be electrically connected to at least one of the splicing light-emitting 100a. For example, the first auxiliary signal line 107 and the second auxiliary signal line 108 shown in FIG. 2 are electrically connected to four of the splicing light-emitting units 100a. In order to facilitate connection, the first auxiliary signal line 107 surrounds four of the splicing light-emitting units 100a. The auxiliary signal lines 108 surround four of the splicing light-emitting units 100a. The first auxiliary signal lines 107 are in an U-shape. The second auxiliary signal lines 108 are in an inverted U-shape. The first auxiliary signal lines 107 and the second auxiliary signal lines 108 are arranged in a staggered manner. That is, the legs of the U-shaped first auxiliary signal line 107 and the inverted U-shaped second auxiliary signal line 108 that are close to each other are positioned in the opposite U-shaped grooves, respectively. In addition, the legs of the first auxiliary signal line 107 and the second auxiliary signal line 108 that are close to each other are positioned between the two first signal lines 105 and the two second signal lines 106 of two adjacent splicing light-emitting units 100a.

Of course, the above-mentioned arrangements of the first auxiliary signal line 107 and the second auxiliary signal line 108 are only examples, the arrangement of the first auxiliary signal line 107 and the second auxiliary signal line 108 can also be reasonably arranged according to actual needs, which is not specifically limited here.

Figure 3:
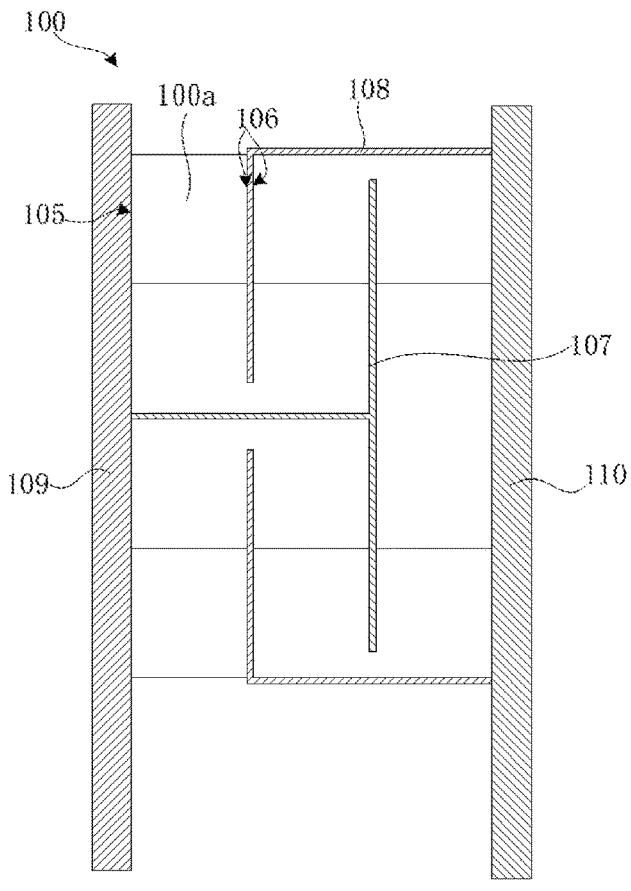
FIG. 3 is another schematic structural diagram of the display panel provided by one embodiment of the present application.

In another embodiment, please refer to FIG. 3, which is another schematic structural diagram of the display panel provided by one embodiment of the present application. A difference between FIG. 3 and FIG. 2 is that, in order to reduce assembly complexity and simplify wiring, the first signal line 105 of a column of the splicing light-emitting 100a disposed adjacent to the first signal bus line 109 is directly electrically connected to the first signal bus line 109 without the first auxiliary signal line 107; and/or, a row of the splicing light-emitting 100a disposed adjacent to the second signal bus line 110 is directly electrically connected to the second signal bus line 110 without the second auxiliary signal line 108, which shorten signal input paths and further reduces the resistances.

And in each column of the splicing light-emitting units 100a located between the two columns of the splicing light-emitting units 100a, that is, in each column of the splicing light-emitting units 100a located in the middle, the first signal line 105 and the second signal line 106 are electrically connected to the first signal bus line 109 and the second signal bus line by the first auxiliary signal line 107 and the second auxiliary signal line 108, respectively.

Figure 4:
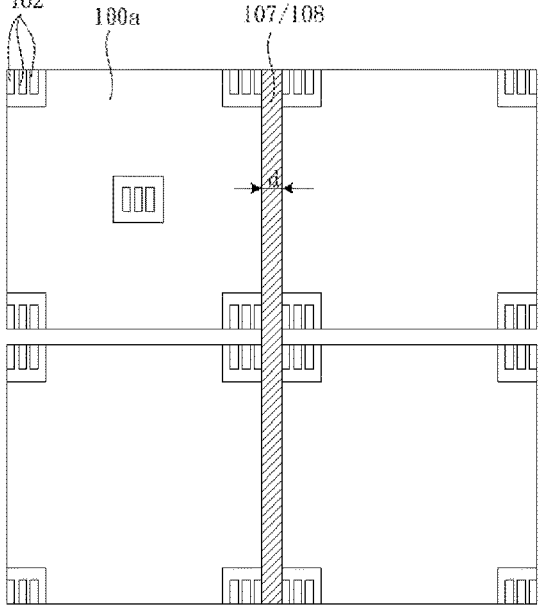
FIG. 4 is a schematic diagram of a partially simplified structure of the display panel provided by one embodiment of the present application.

In order to ensure seamless splicing, considering the splicing error, please refer to FIG. 4, FIG. 4 is a schematic diagram of a partially simplified structure of the display panel provided by one embodiment of the present application. In this embodiment of the present application, a line width d of the first auxiliary signal line 107 is less than an interval size between the two adjacent splicing light-emitting units 100a, and a line width d of the second auxiliary signal line 108 is less than the interval size between two adjacent spliced light-emitting units 100a. The interval size between two adjacent splicing light-emitting units 100a actually refers to a negative tolerance value of the light-emitting element 102 in the adjacent spliced light-emitting units 100a. That is, the line width d of the first auxiliary signal line 107 is less than the negative tolerance value of the light-emitting element 102 in the adjacent splicing light-emitting unit 100a, the line width d of the second auxiliary signal line 108 is less than the negative tolerance value of the light-emitting element 102 in the adjacent splicing light-emitting unit 100a, to ensure that the width of the seam between the two adjacent splicing light-emitting units 100a is reasonable and meets the requirements, to realize the seamless splicing effect.

It should be noted that the negative tolerance value of the light-emitting element 102 is relative to a standard value of the light-emitting element 102. The standard value is a standard value determined by those skilled in the art through experience or experiments. The negative tolerance value is a negative tolerance ratio based on the standard value specified based on an error specification of a machine that manufactures the carrier substrate 101 of the splicing screen unit or module, which is not specifically limited here.

Specifically, the line width of the first auxiliary signal line 107 ranges from 40 micrometers to 200 micrometers, and the line width of the second auxiliary signal line 108 ranges from 40 micrometers to 200 micrometers.

Further, an orthographic projection of the first auxiliary signal line 107 on the carrier substrate 101 covers a corresponding orthographic projection of the first signal line 105 on the carrier substrate 101, and an orthographic projection of the second auxiliary signal line 108 on the carrier substrate 101 covers a corresponding orthographic projection of the second signal line 106 on the carrier substrate 101.

Specifically, the first signal line 105 and the second signal line 106 are arranged in a same layer, the first auxiliary signal line 107 and the second auxiliary signal line 108 are arranged in a same layer, and the first auxiliary signal line 107 and the second auxiliary signal line 108 are plug-in signal lines. For example, the first auxiliary signal line 107 and the second auxiliary signal line 108 are components with conductive properties such as metal sheet or conductive tape.

Further, the display panel 100 further includes a first driving chip (not shown in the figure) and a second driving chip (not shown in the figure). The first driving chip is configured to provide the first input signal. The first driving chip is electrically connected to the first signal bus line 109. The second driving chip is configured to provide the second input signal. The second driving chip is electrically connected to the second signal bus line 110.

One embodiment of the present application further provides a display device, the display device includes at least two assembling mechanisms for the display panel 100. Each of the assembling mechanisms is disposed corresponding to the splicing light-emitting unit 100a, to fix the splicing light-emitting unit 100a on a frame.

Specifically, the display device may be an LCD type display, that is, a liquid crystal display device, which belongs to a type of flat display panel. For example, the liquid crystal display is applied to a liquid crystal television, a mobile phone, a personal digital assistant (PDA), a digital camera, a computer screen, or a notebook computer screen, and the like. The advantages of LCD display are low power consumption, small size, and low radiation. In this case, a plurality of the splicing light-emitting units 100a is used as a backlight source of the display device, and the light-emitting effect thereof will directly affect the visual effect of the liquid crystal display device. An operating principle of the display panel 100 is that liquid crystal molecules are poured between a thin film transistor array substrate (TFT array substrate) and a color filter backplate. A driving voltage is applied on the two backplates to control a rotation direction of the liquid crystal molecules, to refract the light from the carrier substrate 101 to generate a picture The beneficial effects of the present application are as follows: A display panel and a display device are provided by the present application, wherein the display panel includes at least two splicing light-emitting units spliced with each other, by electrically connecting a first signal line and a second signal line to the plurality of light-emitting elements on the first side and the second side of the carrier substrate of each splicing light-emitting unit respectively, electrically connecting the first signal line to the first connection line, and electrically connecting the second signal line to the second connection line, compared with the prior art in which the first input signal and the second input signal are directly input into the light-emitting element through the first connecting line and the second connecting line, a first input signal of the present application is sequentially input to the light-emitting element through the first signal line and the first connection line, and wherein a second input signal of the present application is sequentially input to the light-emitting element through the second signal line and the second connection line to the light-emitting element. Therefore, the input paths of the first input signal and the second input signal are added, so that a resistance of the first connection line and a resistance of the second connection line can be reduced, and the problems of brightness difference and uniformity deterioration of the display device caused by the signal voltage drop can be improved.

To sum up, although the present application has disclosed the above-mentioned preferred embodiments, the above-mentioned preferred embodiments are not intended to limit the present application. Those of ordinary skill in the art can make various changes and modifications without departing from the spirit and scope of the present application. Therefore, a protection scope of the present application is defined by the claims.

What is claimed is:

1. A display panel, comprising at least two splicing light-emitting units spliced with each other, wherein each of the splicing light-emitting unit comprising:
    a carrier substrate;
    a plurality of light-emitting elements arranged in an array on the carrier substrate;
    a plurality of first connection lines disposed on the carrier substrate; and
    a plurality of second connection lines disposed on the carrier substrate;
    wherein first terminals of all the light-emitting elements in a same row are electrically connected in parallel with the first connection lines, and wherein second terminals of all the light-emitting elements in a same row are electrically connected in parallel with the second connection lines;
    wherein a first signal line and a second signal line are respectively disposed on a first side surface of the carrier substrate and a second side surface opposite to the first side surface of the carrier substrate;
    wherein the first signal line is VDD signal line, and wherein the second signal line is a VSS signal line;
    wherein the first signal line is electrically connected to the first connection line, and wherein the second signal line is electrically connected to the second connection line; and
    wherein a first input signal is sequentially input to the light-emitting element through the first signal line and the first connection line, and wherein a second input signal is sequentially input to the light-emitting element through the second signal line and the second connection line to the light-emitting element.

2. The display panel according to claim 1, wherein all the light-emitting elements in the same row are arranged along a first direction, and wherein both the first signal line and the second signal line extend in a second direction intersecting the first direction;
    wherein the first signal lines are positioned on different sides of the carrier substrates of two adjacent splicing light-emitting units in a same row, and wherein the second signal lines are positioned on different sides of the carrier substrates of two adjacent splicing light-emitting units in a same row.

3. The display panel according to claim 2, wherein the first signal lines are positioned on a same side of the carrier substrates of two adjacent splicing light-emitting units in a same column, and wherein the two second signal lines are positioned on a same side of the carrier substrates of two adjacent splicing light-emitting units in a same column.

4. The display panel according to claim 1, wherein the display panel further comprises a first auxiliary signal line and a second auxiliary signal line, wherein the first auxiliary signal line is positioned on at least one side of the splicing light-emitting unit, wherein the second auxiliary signal line is positioned on at least one side of the splicing light-emitting unit, and wherein the first auxiliary signal line and the second auxiliary signal line are correspond to at least two adjacent splicing light-emitting units;

wherein the first auxiliary signal line is electrically connected to the first signal line, and wherein the second auxiliary signal line is electrically connected to the second signal line;

wherein the first input signal is sequentially input to the light-emitting element through the first auxiliary signal line and the first signal line, and wherein the second input signal is sequentially input to the light-emitting element through the second auxiliary signal line and the second signal line.

5. The display panel according to claim 4, wherein the display panel further comprises a first signal bus line and a second signal bus line, wherein the first auxiliary signal line is connected to the first signal bus line, and wherein the second auxiliary signal line is connected to the second signal bus line; and wherein the first input signal is sequentially input to the light-emitting element through the first signal bus line, the first auxiliary signal line, and the first signal line, and wherein the second input signal is sequentially input to the light-emitting element through the second signal bus line, the second auxiliary signal line, and the second signal line.

6. The display panel according to claim 5, wherein a line width of the first auxiliary signal line is less than an interval size between the two adjacent splicing light-emitting units, and wherein a line width of the second auxiliary signal line is less than the interval size between the two adjacent splicing light-emitting units.

7. The display panel according to claim 6, wherein the line width of the first auxiliary signal line ranges from 40 micrometers to 200 micrometers, and wherein the line width of the second auxiliary signal line ranges from 40 micrometers to 200 micrometers.

8. The display panel according to claim 4, wherein the first signal line and the second signal line are arranged in a same layer, wherein the first auxiliary signal line and the second auxiliary signal line are arranged in a same layer, and wherein the first auxiliary signal line and the second auxiliary signal line are plug-in signal lines.

9. A display panel, comprising at least two splicing light-emitting units spliced with each other, wherein each of the splicing light-emitting unit comprising:

a carrier substrate;

a plurality of light-emitting elements arranged in an array on the carrier substrate;

a plurality of first connection lines disposed on the carrier substrate; and a plurality of second connection lines disposed on the carrier substrate;

wherein first terminals of all the light-emitting elements in a same row are electrically connected with the first connection lines, and wherein second terminals of all the light-emitting elements in a same row are electrically connected with the second connection lines;

wherein a first signal line and a second signal line are respectively disposed on a first side surface of the carrier substrate and a second side surface opposite to the first side surface of the carrier substrate;

wherein the first signal line is electrically connected to the first connection line, and wherein the second signal line is electrically connected to the second connection line; and wherein a first input signal is sequentially input to the light-emitting element through the first signal line and the first connection line, and wherein a second input signal is sequentially input to the light-emitting element through the second signal line and the second connection line to the light-emitting element.

10. The display panel according to claim 9, wherein all the light-emitting elements in the same row are arranged along a first direction, and wherein both the first signal line and the second signal line extend in a second direction intersecting the first direction;

wherein the first signal lines are positioned on different sides of the carrier substrates of two adjacent splicing light-emitting units in a same row, and wherein the second signal lines are positioned on different sides of the carrier substrates of two adjacent splicing light-emitting units in a same row.

11. The display panel according to claim 10, wherein the first signal lines are positioned on a same side of the carrier substrates of two adjacent splicing light-emitting units in a same column, and wherein the two second signal lines are positioned on a same side of the carrier substrates of two adjacent splicing light-emitting units in a same column.

12. The display panel according to claim 9, wherein the display panel further comprises a first auxiliary signal line and a second auxiliary signal line, wherein the first auxiliary signal line is positioned on at least one side of the splicing light-emitting unit, wherein the second auxiliary signal line is positioned on at least one side of the splicing light-emitting unit, and wherein the first auxiliary signal line and the second auxiliary signal line are correspond to at least two adjacent splicing light-emitting units;

wherein the first auxiliary signal line is electrically connected to the first signal line, and wherein the second auxiliary signal line is electrically connected to the second signal line;

wherein the first input signal is sequentially input to the light-emitting element through the first auxiliary signal line and the first signal line, and wherein the second input signal is sequentially input to the light-emitting element through the second auxiliary signal line and the second signal line.

13. The display panel according to claim 12, wherein the display panel further comprises a first signal bus line and a second signal bus line, wherein the first auxiliary signal line is connected to the first signal bus line, and wherein the second auxiliary signal line is connected to the second signal bus line; and wherein the first input signal is sequentially input to the light-emitting element through the first signal bus line, the first auxiliary signal line, and the first signal line, and wherein the second input signal is sequentially input to the light-emitting element through the second signal bus line, the second auxiliary signal line, and the second signal line.

14. The display panel according to claim 13, wherein a line width of the first auxiliary signal line is less than an interval size between the two adjacent splicing light-emitting units, and wherein a line width of the second auxiliary signal line is less than the interval size between the two adjacent splicing light-emitting units.

15. The display panel according to claim 14, wherein the line width of the first auxiliary signal line ranges from 40 micrometers to 200 micrometers, and wherein the line width of the second auxiliary signal line ranges from 40 micrometers to 200 micrometers.

16. The display panel according to claim 12, wherein the first signal line and the second signal line are arranged in a same layer, wherein the first auxiliary signal line and the second auxiliary signal line are arranged in a same layer, and wherein the first auxiliary signal line and the second auxiliary signal line are plug-in signal lines.

17. The display panel according to claim 9, wherein all the light-emitting elements in a same row are connected in parallel with the first connection line and the second connection line, respectively.

18. The display panel according to claim 9, wherein the light-emitting element is a Mini-LED or a Micro-LED.

19. The display panel according to claim 9, wherein the first signal line is VDD signal line, and wherein the second signal line is a VSS signal line.

20. A display device, comprising:

a display panel comprising at least two splicing light-emitting units spliced with each other, wherein each of the splicing light-emitting unit comprising:

a carrier substrate;

a plurality of light-emitting elements arranged in an array on the carrier substrate;

a plurality of first connection lines disposed on the carrier substrate;

a plurality of second connection lines disposed on the carrier substrate; and at least two assembling mechanisms, wherein each of the assembling mechanisms is disposed corresponding to the splicing light-emitting unit, to fix the splicing light-emitting unit on a frame;

wherein first terminals of all the light-emitting elements in a same row are electrically connected with the first connection lines, and wherein second terminals of all the light-emitting elements in a same row are electrically connected with the second connection lines;

wherein a first signal line and a second signal line are respectively disposed on a first side surface of the carrier substrate and a second side surface opposite to the first side surface of the carrier substrate;

wherein the first signal line is electrically connected to the first connection line, and wherein the second signal line is electrically connected to the second connection line; and wherein a first input signal is sequentially input to the light-emitting element through the first signal line and the first connection line, and wherein a second input signal is sequentially input to the light-emitting element through the second signal line and the second connection line to the light-emitting element.

* * * * *